United States Patent
Jung et al.

(10) Patent No.: US 10,037,795 B2
(45) Date of Patent: Jul. 31, 2018

(54) SEVEN-TRANSISTOR STATIC RANDOM-ACCESS MEMORY BITCELL WITH REDUCED READ DISTURBANCE

(71) Applicant: QUALCOMM Incorporated, San Diego, CA (US)

(72) Inventors: Seong-Ook Jung, Seoul (KR); Younghwi Yang, Seoul (KR); Stanley Seungchul Song, San Diego, CA (US); Zhongze Wang, San Diego, CA (US); Choh Fei Yeap, San Diego, CA (US)

(73) Assignees: QUALCOMM Incorporated, San Diego, CA (US); INDUSTRY-ACADEMIC COOPERATION FOUNDATION, Seoul (KR)

( * ) Notice: Subject to any disclaimer, the term of this patent is extended or adjusted under 35 U.S.C. 154(b) by 0 days.

(21) Appl. No.: 14/499,149

(22) Filed: Sep. 27, 2014

(65) Prior Publication Data
US 2016/0093365 A1    Mar. 31, 2016

(51) Int. Cl.
*G11C 11/00* (2006.01)
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC .................................... G11C 11/419
USPC ....................................... 365/154
See application file for complete search history.

(56) References Cited

U.S. PATENT DOCUMENTS

| 5,680,356 | A | * | 10/1997 | Yamauchi | G11C 11/412 |
| | | | | | 365/189.11 |
| 7,295,459 | B2 | | 11/2007 | Islam | |
| 7,890,907 | B2 | | 2/2011 | Kim et al. | |
| 7,920,409 | B1 | | 4/2011 | Clark et al. | |
| 8,441,829 | B2 | | 5/2013 | Huang et al. | |
| 8,498,143 | B2 | | 7/2013 | Deng | |
| 8,717,807 | B2 | | 5/2014 | Chuang et al. | |
| 2009/0285011 | A1 | * | 11/2009 | Pradhan | G11C 11/412 |
| | | | | | 365/156 |

OTHER PUBLICATIONS

International Search Report and Written Opinion—PCT/US2015/050236—ISA/EPO—dated Dec. 11, 2015.

* cited by examiner

*Primary Examiner* — Tha-O H Bui
(74) *Attorney, Agent, or Firm* — Muncy, Geissler, Olds & Lowe, P.C./Qualcomm

(57) ABSTRACT

Systems and methods relate to a seven transistor static random-access memory (7T SRAM) bit cell which includes a first inverter having a first pull-up transistor, a first pull-down transistor, and a first storage node, and a second inverter having a second pull-up transistor, a second pull-down transistor, and a second storage node. The second storage node is coupled to gates of the first pull-up transistor and the first pull-down transistor. A transmission gate is configured to selectively couple the first storage node to gates of the second pull-up transistor and the second pull-down transistor during a write operation, a standby mode, and a hold mode, and selectively decouple the first storage node from gates of the first pull-up transistor and a first pull-down transistor during a read operation. The 7T SRAM bit cell can be read or written through an access transistor coupled to the first storage node.

26 Claims, 10 Drawing Sheets

7T SRAM

6T SRAM

8T SRAM

STANDBY

HOLD

WRITE "0"

SEVEN-TRANSISTOR STATIC RANDOM-ACCESS MEMORY BITCELL WITH REDUCED READ DISTURBANCE

FIELD OF DISCLOSURE

Disclosed aspects include systems and methods related to a seven transistor static random-access memory (7T SRAM) bit cell. Exemplary aspects relate to 7T SRAM bit cells having reduced read disturbance and susceptibility to half-select problems, and improved noise margins.

BACKGROUND

Memory devices conventionally include arrays of bit cells that each store a bit of data. Each data bit can represent a logical zero ("0") or a logical one ("1"), which may correspond to a state of the bit cell. During a read operation of a selected bit cell, a low voltage level represents a logical "0" and a relatively higher voltage level represents a logical "1".

FIG. 1 illustrates a conventional six-transistor static random-access memory (6T SRAM) bit cell 100. The bit cell 100 comprises a pair of cross-coupled inverters, each cross-coupled inverter comprising a p-channel metal oxide semiconductor (PMOS) pull-up transistor and an n-channel metal oxide semiconductor (NMOS) pull-down transistor separated by a storage node. The first inverter comprises a first storage node 110 which stores a first logical value. The first storage node 110 is arranged between a first pull-up transistor 112 and a first pull-down transistor 114. The second inverter comprises a second storage node 120 which stores a second logical value. The second storage node 120 is arranged between a second pull-up transistor 122 and a second pull-down transistor 124. When the pair of inverters are cross-coupled, the first logical value is the opposite or inverse of the second logical value.

In a read operation of bit cell 100, the bit line 150 and bit line 160 are both pre-charged. Then the word line 170 is set to a high-voltage state in order to select bit cell 100, which turns on transistors 152 and 162. If the 6T SRAM bit cell 100 stores a logical "1," without loss of generality, a logical "1" appears at the first storage node 110 of the first inverter and a logical "0" appears at the second storage node 120 of the second inverter. By turning on the access transistors 152 and 162 the voltage on the bit line 150 will be maintained by the pull-up transistor 112, whereas the voltage on the bit line 160 will be discharged by the pull-down transistor 124. Sense amplifiers (not shown) are used to amplify the differential voltage which appears on bit line 150 and bit line 160, and a logical value of "1" is read. On the other hand, if a logical "0" is stored in bit cell 100, a logical "0" appears at the first storage node 110 and a logical "1" appears at the second storage node 120. Reading bit cell 100 results in the opposite of the above process, in the sense that bit line 150 will be discharged and bit line 160 will remain charged to a high voltage, eventually leading to a logical value of "0" being read.

In a write operation of bit cell 100, for the case of writing a logical "1," bit line 150 is driven to a high-voltage state, and bit line 160 is driven to a low-voltage state. Then the word line 170 is set to a high-voltage state to select bit cell 100, which turns on access transistors 152 and 162. Since the bit line 150 is in a high-voltage state, a logical "1" will be written to the first storage node 110 and, since the bit line 160 is in a low-voltage state, a logical "0" will be written to the second storage node 120. For the write of a logical "0," the opposite process is followed, in the sense that bit line 160 will be driven to a high-voltage state and the bit line 150 will be driven to a low-voltage state.

As memory devices become smaller, a problem arises in that their reliability and performance decrease. For example, a static noise margin (SNM) is defined as the minimum noise voltage (as measured between the first storage node 110 and the second storage node 120) which is capable of inadvertently flipping the state of the bit cell. A read static noise margin (RSNM) is defined as the amount of noise voltage capable of inadvertently flipping the state of the bit cell during a read operation of the bit cell. As bit cells become smaller, size constraints can reduce the RSNM of the bit cells, causing them to become more sensitive to noise resulting from, for example, temperature changes or process variations.

FIG. 2 illustrates a conventional eight-transistor static random-access memory (8T SRAM) bit cell 200. In bit cell 200, the data storage nodes 210 and 220, analogous to the storage nodes 110 and 120 of a conventional 6T SRAM bit cell such as bit cell 100, are decoupled from a read bit line 282 using decoupling transistors 280 and 290. Because the read bit line 282 is decoupled from the data storage nodes 210 and 220, a read operation is much less likely to cause an inadvertent flipping of the state of the bit cell. Thus, the RSNM of bit cell 200 is higher than or equal to a hold SNM (HSNM) which pertains to the noise margin when no active read/write operation is in progress for bit cell 200. However, since the bit cell 200 consists of two extra decoupling transistors 280 and 290, the area of the bit cell increases.

Moreover, in addition to the read bit line 282, the bit cell 200 includes a read word line 272 which is activated for read operations on the bit cell 200. Further, the bit cell 200 comprises separate write bit lines 250 and 260 and a separate write word line 270 for write operations. The write bit lines 250 and 260 are analogous to the bit lines 150 and 160 of bit cell 100, except that they are not used during a read operation. Similarly, the write word line 270 is analogous to the word line 170 of bit cell 100, except that the write word line 270 is not used during a read operation.

A further advantage of the 8T SRAM of FIG. 2 is that different transistors are used for read and write operations. Because different transistors are used for read and write operations, the respective transistors can be independently optimized. For example, write speed can be improved by strengthening the write access transistors 252 and 262. However, strengthening the write access transistors can create a problem where a write operation on a target bit cell can affect not only the target bit cell, but also every other cell in the target bit cell's row. The write operation can affect the whole row because the write word line is disposed in a row direction of the memory array (i.e., each bit cell in a given row of the memory array shares a single write word line). This problem, known as the "half-select" problem, can impair the reliability of a write-speed-optimized 8T SRAM such as the one depicted in FIG. 2.

One proposed solution to the half-select problem in 8T SRAM is a write-back scheme employed for write operations. In a write-back scheme, every bit cell in a row is first read to determine a stored value. The stored value is then modified based on the data to be written, and this modified value is written back to all the bit cells, including one or more target bit cells. By performing a write operation on every bit cell in a row containing the one or more target bit cells, the write-back scheme avoids the problem of inadvertently causing a disturbance in a bit cell which merely shares a row with a target bit cell.

However, a write-back scheme has its own drawbacks. Particularly, power consumption increases because both read and write operations are performed for an entire row for every write cycle.

Accordingly, there is a need for improving noise margins and data stability of bit cells while avoiding the aforementioned drawbacks of the conventional approaches.

SUMMARY

Exemplary aspects include systems and methods related to a seven transistor static random-access memory (7T SRAM) bit cell. In particular, exemplary aspects relate to a 7T SRAM bit cell having reduced read disturbance and susceptibility to half-select problems, and improved noise margins.

For example, an exemplary aspect is directed to a seven transistor static random-access memory (7T SRAM) bit cell comprising: a first inverter comprising a first pull-up transistor, a first pull-down transistor, and a first storage node and a second inverter comprising a second pull-up transistor, a second pull-down transistor, and a second storage node, wherein the second storage node is coupled to gates of the first pull-up transistor and the first pull-down transistor. An access transistor is coupled to the first storage node, and a transmission gate configured to selectively couple the first storage node to gates of the second pull-up transistor and the second pull-down transistor Another exemplary aspect is directed to a method of operating a seven transistor static random-access memory (7T SRAM) bit cell, the method comprising: during a read operation, selectively decoupling a first storage node of a first inverter from gates of a second inverter, wherein a second storage node of the second inverter is coupled to gates of the first inverter, and reading a data value stored in the first storage node through an access transistor coupled to the first storage node. In optional aspects the method may further include selectively coupling the first storage node of the first inverter to gates of the second inverter during a write operation, a standby mode, and a hold mode Yet another exemplary aspect is directed to a system comprising: a seven transistor static random-access memory (7T SRAM) bit cell, means for selectively decoupling a first storage node of a first inverter from gates of a second inverter of the 7T SRAM bit cell during a read operation, wherein a second storage node of the second inverter is coupled to gates of the first inverter, and means for reading a data value stored in the first storage node. In optional aspects, the system further includes means for selectively coupling the first storage node of the first inverter to gates of the second inverter during a write operation, a standby mode, and a hold mode.

BRIEF DESCRIPTION OF THE DRAWINGS

The accompanying drawings are presented to aid in the description of embodiments of the invention and are provided solely for illustration of the embodiments and not limitation.

DETAILED DESCRIPTION

Figure 1:
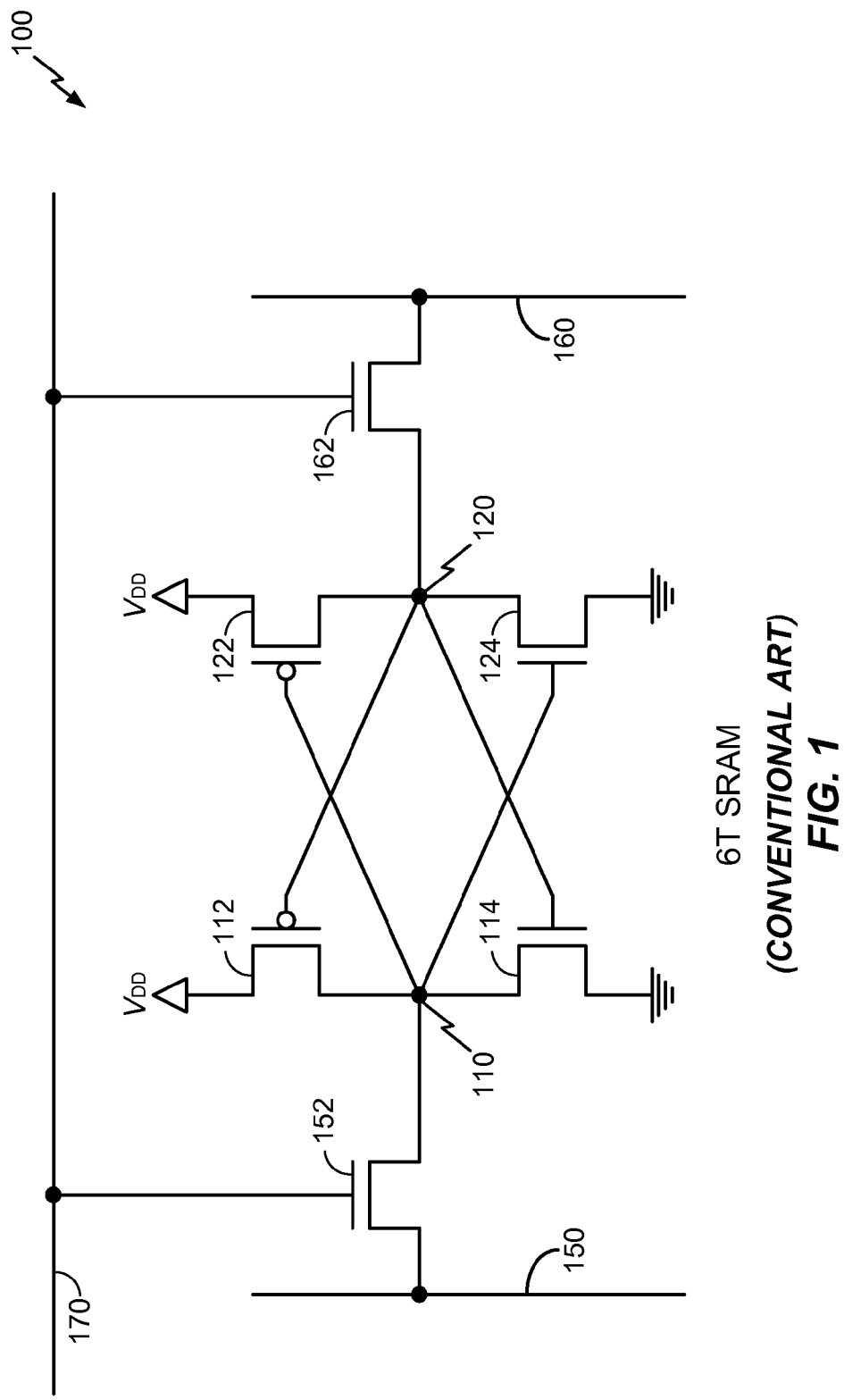
FIG. 1 illustrates a schematic diagram of a conventional 6T SRAM.
Figure 2:
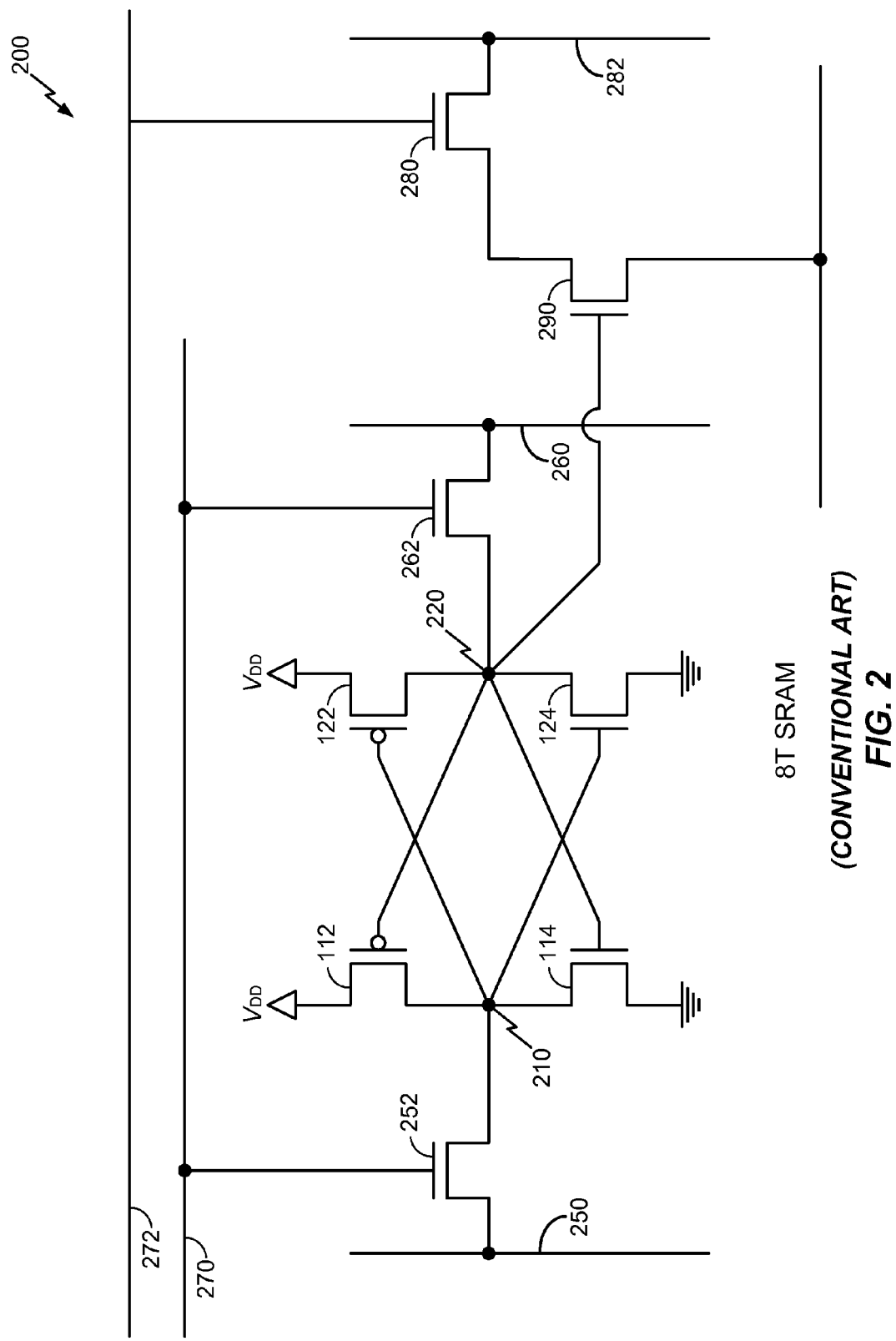
FIG. 2 illustrates a schematic diagram of a conventional 8T SRAM.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In this disclosure, signals $V_{DD}$ and $V_{SS}$ are voltage signals or voltage levels pertaining to positive supply voltage and negative supply voltage/ground, respectively. In some aspects, a signal value represented as $V_{DD}$ may be used to convey "logic high" or "logical 1". Likewise, a signal value represented as $V_{SS}$ may be used to convey "logic low", "logical 0", "zero", or "ground". In general, signals $V_{DD}$ and $V_{SS}$, however referred to, may be used to describe two signals which are distinguishable from one another, representing logical values of "1" and a "0" respectively.

Referring back to the previously described conventional 6T SRAM bit cells, these conventional bit cells exhibit a decreasing read static noise margin as the size of memory devices decreases. Utilizing 8T SRAMs to combat this problem by isolating read operations from write operations necessitates the use of two extra transistors. Moreover, employing a write-back scheme to resolve the half-select issue in 8T SRAMs results in an increase in power consumption.

To overcome the above drawbacks, in exemplary aspects, the half-select issue can be avoided by utilizing a single bit line for accessing a storage cell and controlling the cross-coupling of inverters which form the storage cell via a transmission gate in an exemplary 7T SRAM structure. All the transmission gates of exemplary 7T SRAM cells in a selected row can be turned off during a read operation. This avoids the need for a write-back scheme, and dynamic power consumption can be reduced. Moreover, because there is a single bit line, overall bit line leakage decreases, thereby reducing standby power consumption.

Figure 3:
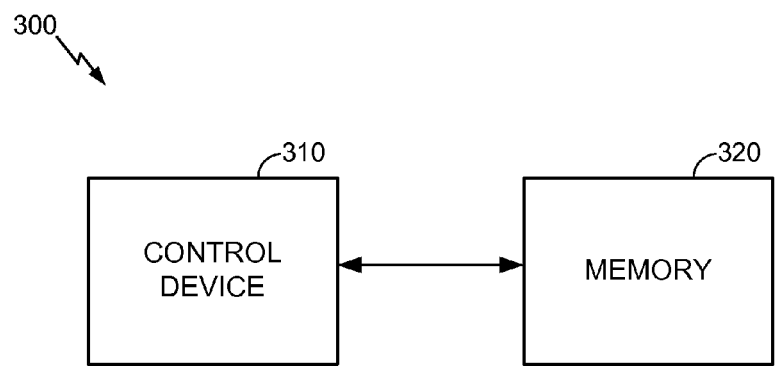
FIG. 3 illustrates a high-level diagram of a memory device and a control device according to an exemplary aspect.

FIG. 3 generally illustrates a system 300 for reading and/or writing a memory 320 according to an exemplary aspect. In the system 300, a control device 310 sends memory control signals to the memory 320. Memory 320 comprises an array of bit cells which are arranged in rows and columns. The memory control signals may comprise read commands, write commands, data addresses which identify one or more of a row, a column, and/or a specific bit cell, and/or other signals which control the operations of memory 320.

Figure 4:
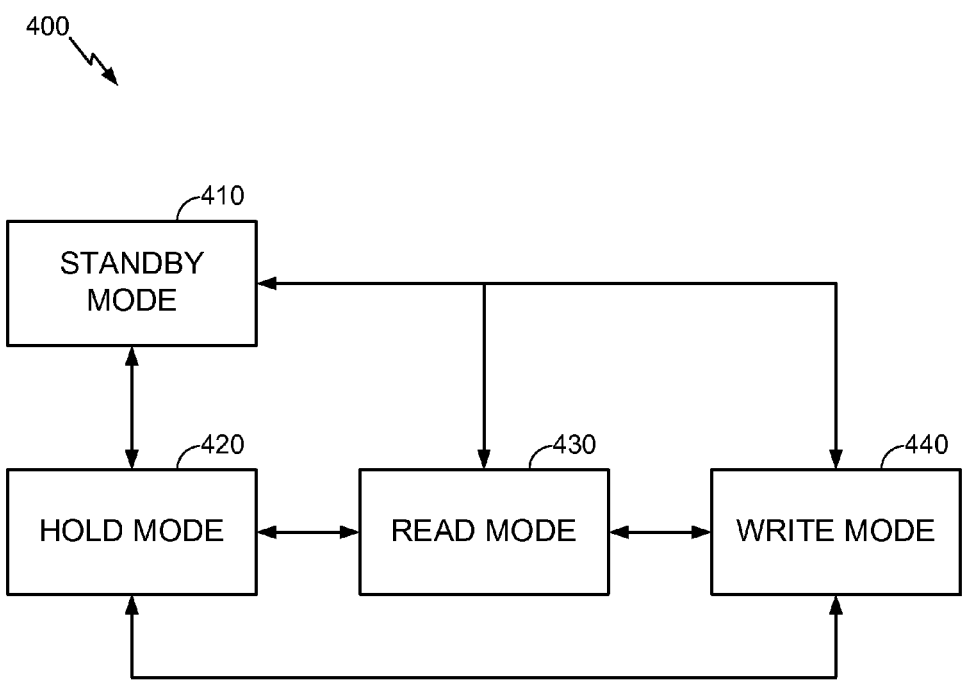
FIG. 4 illustrates a high-level state diagram of a memory device according to an exemplary aspect.

FIG. 4 generally illustrates a state diagram 400 for a bit cell belonging to the memory 320 according to an embodiment. The state of the bit cell may be controlled by the control device 310. In a standby operation during a standby mode 410, the memory 320 is in a standby or sleep mode and the bit cell is not being actively used. In some cases, the entire memory 320 may be powered down partially or completely, based on specific implementations, in the standby mode 410. Therefore, during the standby mode 410, the static memory bit cell is configured to maintain the data stored therein, while minimizing power consumption.

In active modes such as hold mode 420, read mode 430, and write mode 440, the memory 320 is not in a sleep mode. When the memory 320 is active, each of the bit cells belonging to memory 320 is either in read mode 430 (if data is being read from the bit cell), write mode 440 (if data is being written to the bit cell), or hold mode 420. In the hold mode 420, the state of the bit cell is maintained. The hold mode 420 may be distinguished from the sleep mode 410, in example cases where the hold mode 420 may be entered for a particular bit cell while read/write operations are being performed in other bit cells within the memory 320. Thus, for a particular bit cell, the state of the bit cell is maintained during the hold mode. In the read mode 430, at least one read operation to obtain data in a bit cell is performed. In the write mode 440, at least one bit cell is written with a data value.

Figure 5:
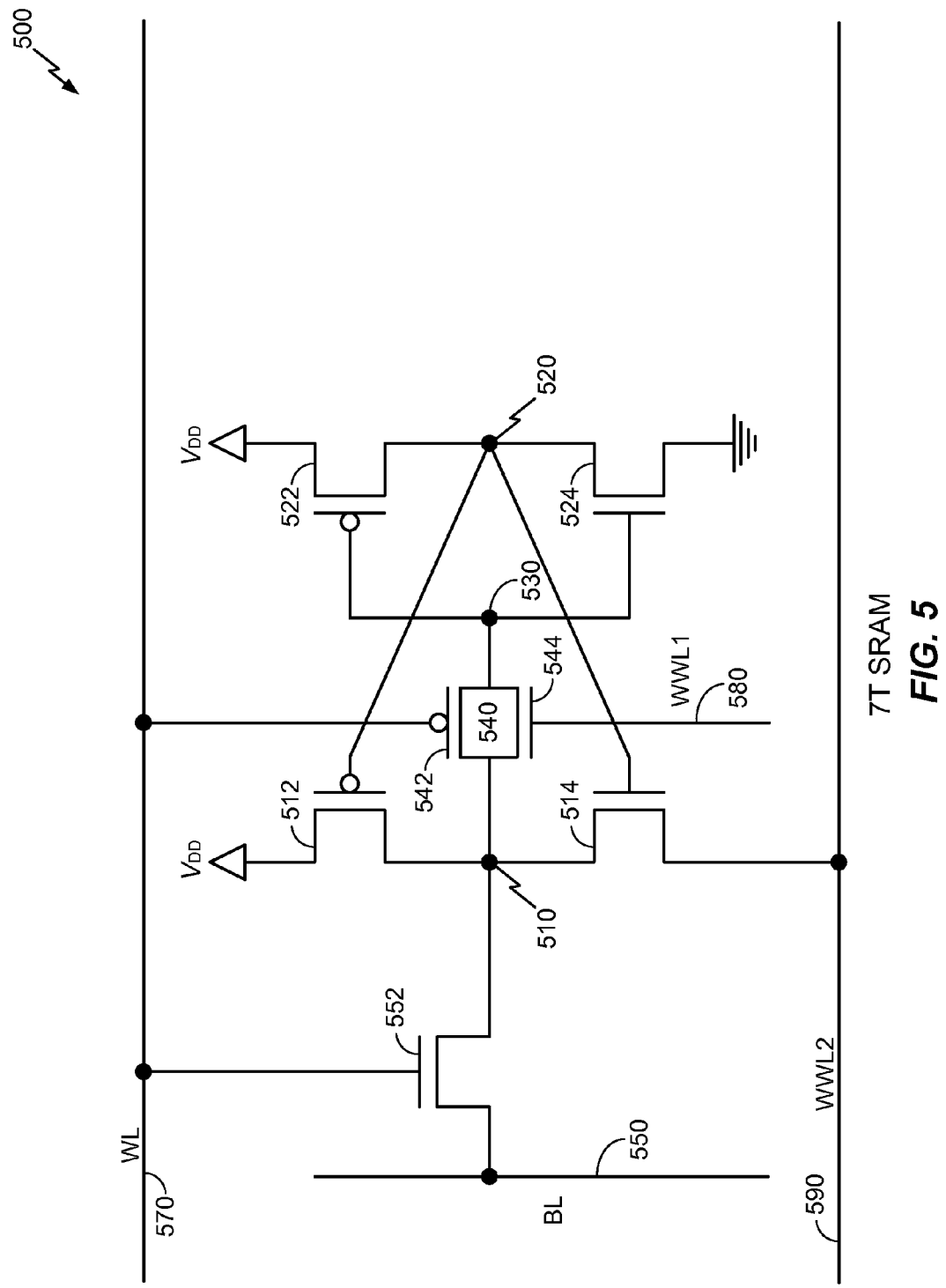
FIG. 5 illustrates a schematic of a seven-transistor static random-access memory (7T SRAM) according to an exemplary aspect.

FIG. 5 generally illustrates a schematic of a seven-transistor bit cell 500. Bit cell 500 is configured as a 7T SRAM bit cell in exemplary aspects. Memory 320 may comprise an array of bit cells such as bit cell 500. Bit cell 500 comprises a first inverter comprising first storage node 510 lying between a first pull-up (PMOS) transistor 512 and first pull-down (NMOS) transistor 514, and a second inverter comprising second storage node 520 lying between a second pull-up (PMOS) transistor 522 and a second pull-down (NMOS) transistor 524. First storage node 510 is coupled to bit line (BL) 550 via access transistor 552, which can be activated (turned 'ON') or deactivated (turned 'off'). Bit line 550 may be disposed in a column direction of the array. Access transistor 552 may be an NMOS transistor with a gate coupled to word line 570.

In bit cell 500, the gates of transistors 512 and 514 are coupled to one another and to second storage node 520. The gates of transistors 522 and 524 are coupled to one another, but, in contrast to bit cell 100, the gates of transistors 522 and 524 are not directly coupled to first storage node 510. Instead, the gates of 522 and 524 are separated from first storage node 510 by transmission gate 540 comprising PMOS transistor 542 and NMOS transistor 544, arranged in parallel such that their respective terminals are coupled to each other's as shown. Both PMOS transistor 542 and NMOS transistor 544 can be independently activated (turned 'ON') or deactivated (turned 'off'). Gate node 530 is coupled to the first storage node 510 via the transmission gate 540. The gate of PMOS transistor 542 is coupled to word line (WL) 570, which may be disposed in a row direction of the array. The gate of NMOS transistor 544 is coupled to a first write word line (WWL1) 580, which may be disposed in a column direction of the array. NMOS transistor 524 is coupled to ground, but NMOS transistor 514 is coupled to second write word line (WWL2) 590, which is disposed in a row direction of the array.

Figure 6:
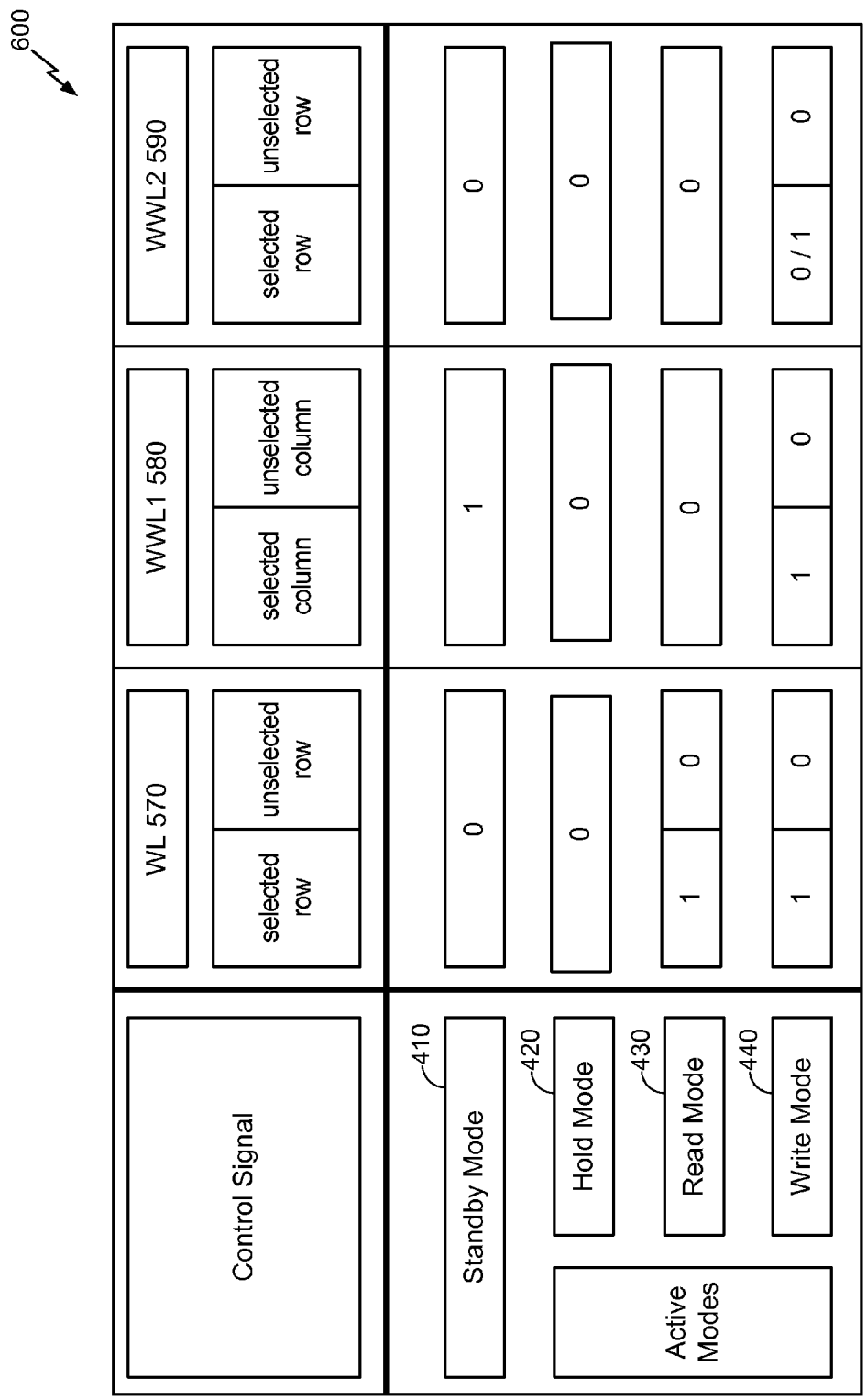
FIG. 6 illustrates a control table of controlling operations of a 7T SRAM according to an exemplary aspect.

FIG. 6 generally illustrates a control table 600 which may be used by control device 310 to control each bit cell 500 in memory 320 in accordance with the state diagram 400. The control device 310 controls bit line 550, word line 570, and the first and second write word lines 580 and 590 of bit cell 500. Word line 570, the first write word line 580, and second write word line 590 may be controlled in accordance with the control table 600 (as will be further discussed below with respect to FIG. 7 through FIG. 11).

The control table 600 shows modes 410, 420, 430, and 440 and behaviors of word line 570, first write word line 580, and second write word line 590 for selected and unselected rows and columns. Control device 310, which controls the signals applied to each bit cell 500 in memory 320, controls the behavior of each bit cell 500 in memory 320. In particular, each of word line 570, first write word line 580, and second write word line 590 are controlled based on the table 600. Once a mode is selected, the signals listed in the table 600 are applied to word line 570, first write word line 580, and second write word line 590, respectively.

In standby mode 410, word line 570 and second write word line 590 are driven to logic "0", while first write word line 580 is driven to logic "1". In hold mode 420, each of word line 570, first write word line 580, and second write word line 590 are driven to logic "0".

In read mode 430, first write word line 580 and second write word line 590 are driven to logic "0". But the signal applied to word line 570 differs on a row-by-row basis. In a read operation, a specific bit cell from the memory 320 is targeted. The specific bit cell is identified by the row and column in which it is disposed. The row with which the target bit cell is associated is the "selected" row, whereas the remaining rows are "unselected". (The control device 310 also controls other signals, including a signal applied to bit line 550 of each bit cell, but this aspect of the control scheme is not shown in control table 600.) As can be seen from FIG. 6, the control device 310 drives the selected row (that is, the row associated with the bit cell 500 targeted for a read operation) to "1", and each unselected row to "0". As can be seen in FIG. 5, the signal applied to word line 570 is delivered to the respective gates of access transistor 552 and PMOS transistor 542 of transmission gate 540.

In write mode 440, the signal applied to word line 570, first write word line 580, or second write word line 590 is always a function of whether the signal is being applied to a selected row or column or to an unselected row or column. In particular, word line 570 associated with the row of the bit cell targeted for the write operation (i.e., the selected row) is driven to "1". The second write word line 590 for the selected row is driven to "0" or "1" based on whether the write operation is for a logic "0" or a logic "1" respectively. Moreover, the first write word line 580 associated with the column of the bit cell targeted for the write operation (i.e., the selected column) is also driven to "1". All unselected rows and columns are driven to "0".

Figure 7:
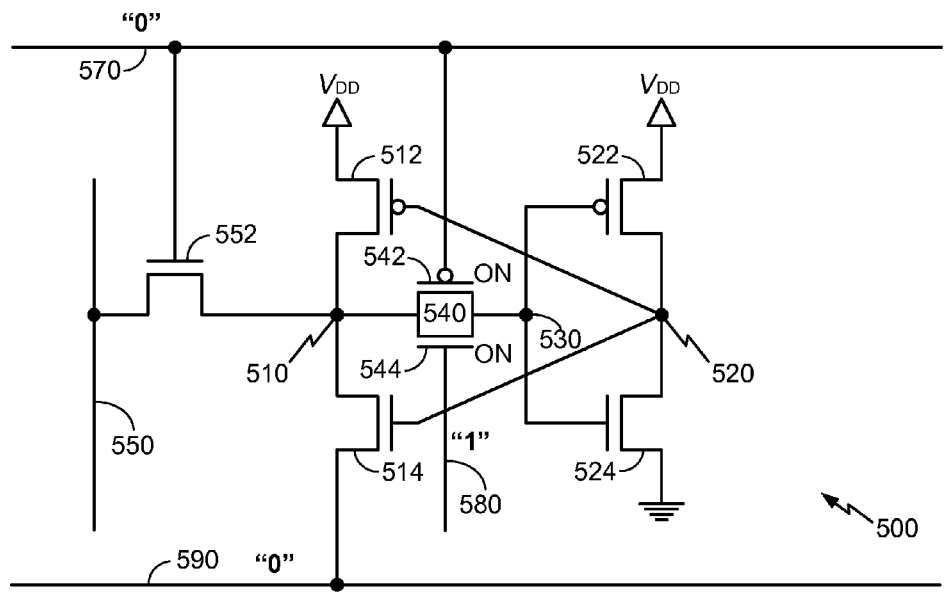
FIG. 7 illustrates the 7T SRAM of FIG. 5 while in a standby mode according to an exemplary aspect.

FIG. 7 generally illustrates bit cell 500 in a standby mode 410. In standby mode 410, word line 570 is set to "0", the first write word line 580 is set to "1", and second write word line 590 is set to "0". As a result, both of the transistors 542 and 544 are in an 'ON' configuration, and current flows freely between first storage node 510 and gate node 530. As a result, in standby mode 410, operation of bit cell 500 is similar to operation of 6T SRAM bit cell 100. In particular, the inverters are cross-coupled. The coupling of first storage node 510 to the gates of transistors PMOS transistor 522 and NMOS transistor 524 and the coupling of second storage node 520 to the gates of transistors 512 and 514 ensures that the data stored at first storage node 510 and second storage node 520 is maintained. Unlike a standby mode of six-transistor memory bit cell 100, there is only a single bit line. Therefore, the amount of bit line leakage is reduced, and less power is consumed during standby mode 410.

Figure 8:
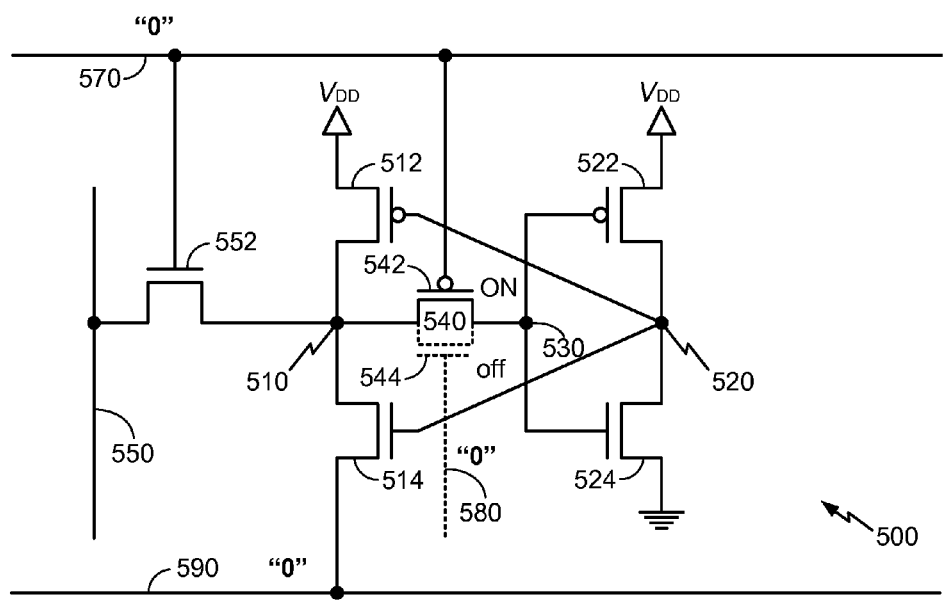
FIG. 8 illustrates the 7T SRAM of FIG. 5 while in a hold mode according to an exemplary aspect.

FIG. 8 generally illustrates the schematic of FIG. 5 when the bit cell 500 is in a hold mode 420. In hold mode 420, word line 570 and second write word line 590 are set to "0", just as in the standby mode 410. However, in contrast to the standby mode 410, the first write word line 580 is also set to "0". As a result, PMOS transistor 542 is in an 'ON' configuration, but NMOS transistor 544 is in an 'off' configuration. In the arrangement of FIG. 8, the state of the bit cell 500 is maintained.

Figure 9:
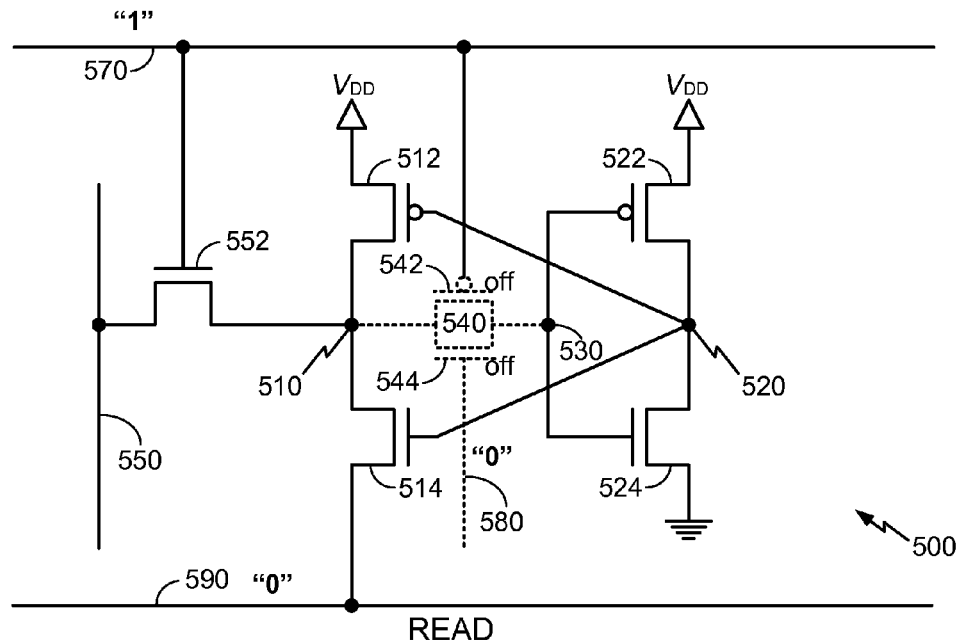
FIG. 9 illustrates the 7T SRAM of FIG. 5 while in a read mode according to an exemplary aspect.

FIG. 9 generally illustrates the schematic of FIG. 5 when the bit cell 500 is in a read mode 430. In read mode 430, word line 570 is set to "1" and the first write word line 580 is set to "0". As a result, both transistors 542 and 544 are in an 'off' configuration, which decouples first storage node 510 from gate node 530. The decoupling of first storage node 510 from gate node 530 reduces the probability of a read disturbance. In a particular example, when bit cell 500 stores a logical "0", which means that first storage node 510 has a value of logical "0" and second storage node 520 has a value of logical "1", a read operation in which voltage is discharged from bit line 550 through the NMOS transistor 514 may cause a voltage rise at first storage node 510. This potential rise in voltage is caused by a voltage divider effect which may occur when access transistor 552 and NMOS transistor 514 are placed between a high voltage at bit line 550 and a low voltage at second write word line 590. However, the voltage rise at first storage node 510 will not cause a read disturbance because first storage node 510 is decoupled from the gates of 522 and 524. Therefore, a rise in voltage at first storage node 510 that could cause six-transistor memory bit cell 100 to flip will not cause bit cell 500 to flip because first storage node 510 is decoupled from the gates of 522 and 524.

Figure 10:
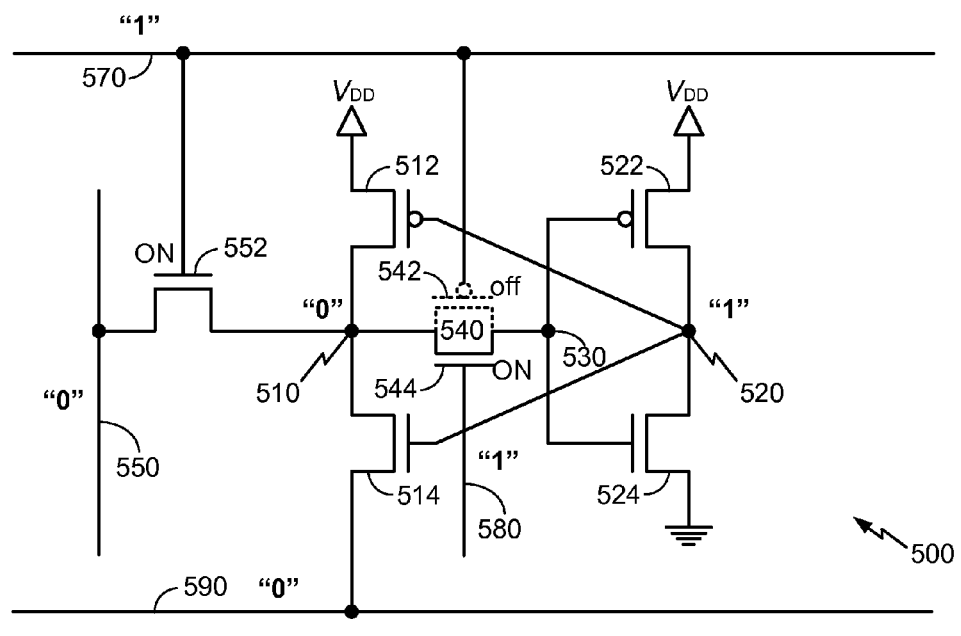
FIG. 10 illustrates the 7T SRAM of FIG. 5 while in a write mode, particularly, a mode for writing a "0", according to an exemplary aspect.
Figure 11:
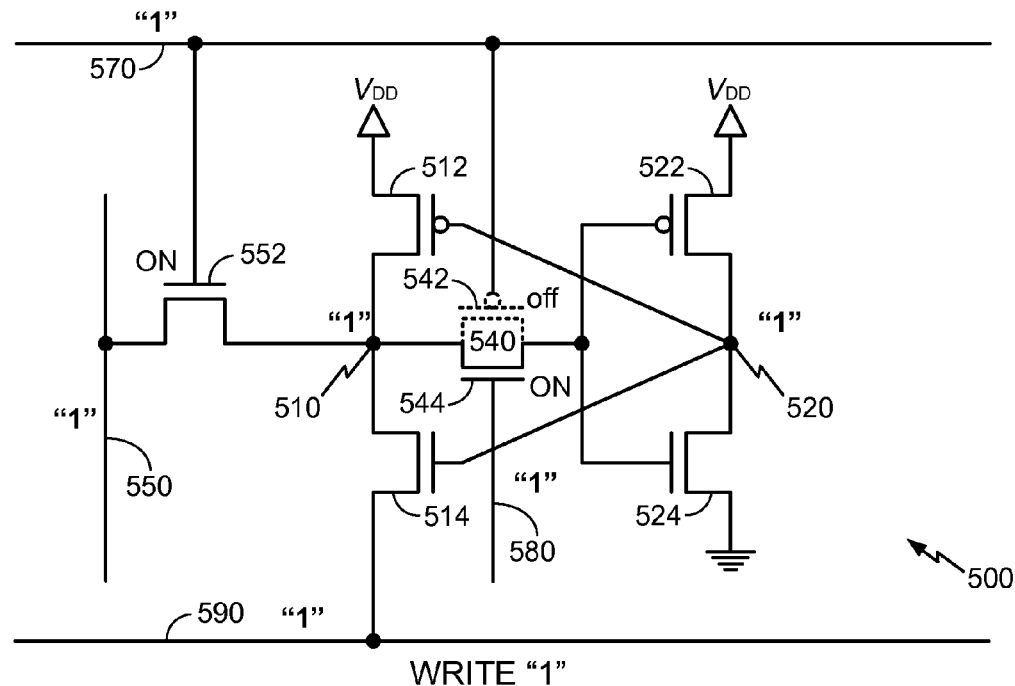
FIG. 11 illustrates the 7T SRAM of FIG. 5 while in a write mode, particularly, a mode for writing a "1", according to an exemplary aspect.

FIG. 10 and FIG. 11 generally illustrate the schematic of FIG. 5 when the bit cell 500 is in a write mode 440. In FIG. 10, bit line 550 and second write world line 590 are both set to a logical "0" so that a data value of "0" can be written to first storage node 510 of the bit cell 500. In write mode 440, generally, word line 570 and first write word line 580 are both set to "1". As a result, access transistor 552 is in an 'ON' configuration. Moreover, PMOS transistor 542 is in an 'off' configuration and NMOS transistor 544 is in an 'ON' configuration.

Therefore, in FIG. 10, current can pass freely from gate node 530 (and the gates of PMOS transistor 522 and NMOS transistor 524) to first storage node 510 via the NMOS transistor 544, and current can pass freely from first storage node 510 to bit line 550 via the access transistor 552. Moreover, current will pass freely from first storage node 510 to second write word line 590 as NMOS transistor 514 begins to pass current. As a result, if there is an initial voltage at first storage node 510 (representing a logical "1"), the foregoing write operation will write a logical "0" to the bit cell 500.

FIG. 11 generally illustrates the schematic of FIG. 5 when the bit cell 500 is in a write mode 440. In FIG. 11, by contrast to FIG. 10, bit line 550 and second write world line 590 are both set to a logical "1" so that data representing a logical "1" can be written to first storage node 510 of the bit cell 500. In write mode 440, generally, word line 570 and first write word line 580 are both set to "1". As a result, access transistor 552 is in an 'ON' configuration. Moreover, PMOS transistor 542 is in an 'off' configuration and NMOS transistor 544 is in an 'ON' configuration.

Therefore, in FIG. 11, current can pass freely from bit line 550 to first storage node 510 via the access transistor 552, and current can pass freely from first storage node 510 to gate node 530 (and the gates of 522 and 524) via the NMOS transistor 544. Moreover, because second write word line 590 is set to a logical "1", current can pass freely to first storage node 510 via access transistor 552. As a result, the foregoing write operation will write a logical "1" to the bit cell 500.

In an array of bit cells comprising rows and columns, there is one word line per row and one bit line per column. Accordingly, every bit cell in a given row shares a single word line, and every bit cell in a given column shares a single bit line. When a particular bit cell in a given row is targeted or selected for a write operation, the word line associated with the selected bit cell is set to "1". Accordingly, the access transistor (e.g., 552) for each bit cell that shares a row with the target bit cell is turned on. This is the cause of the so-called "half-select" problem, wherein every bit cell in a row, including bit cells which are not selected for the write operation, is exposed to charge residing on its respective bit line. Thus, the half-select problem should be mitigated in the bit cells which are not selected for the write operation.

Accordingly, a solution to mitigate the half-select problem will be described with reference to bit cell 500 of FIG. 5. In a scenario where bit cell 500 is half-selected (i.e., is in the same row as a selected bit cell but is not selected for the write operation), word line 570 will be set to "1". As a result, the access transistor 552 will be turned on, and half-selected bit cell 500 will potentially be exposed to charges on bit line 550. However, since word line 570 is also coupled to the gate of PMOS transistor 542, the logic "1" on word line 570 will turn off the PMOS transistor 542. Moreover, as shown in FIG. 6, first write word line 580 is set to "0". Therefore, NMOS transistor 544 will be turned off as well. Since both PMOS transistor 542 and NMOS transistor 544 are turned off, the voltage at gate node 530 will not be disturbed even if the voltage at first storage node 510 experiences volatility as a result of half-selection. Accordingly, the inverter comprising transistors PMOS transistor 522 and NMOS transistor 524, and the bit cell 500 as a whole, will remain in a stable state, and the bit cell 500 will be protected from a half-select issue during the read operation.

Figure 12:
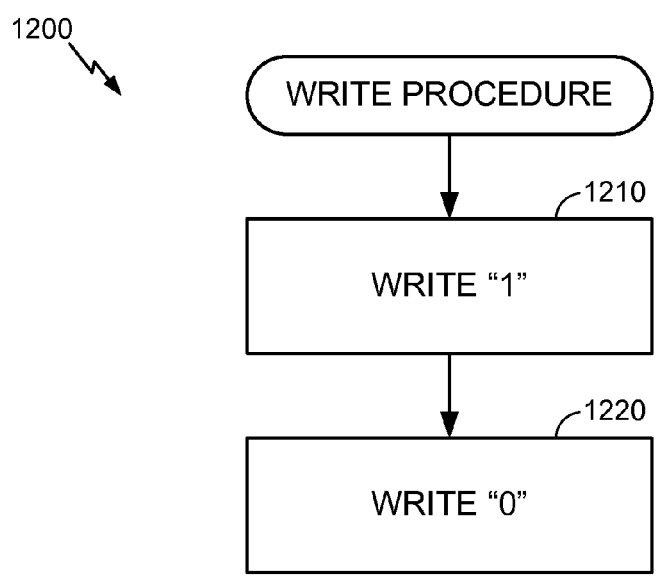
FIG. 12 illustrates a write procedure for controlling a memory device according to an exemplary aspect.

FIG. 12 generally illustrates a write procedure 1200 for controlling the operations of memory 320. The write procedure 1200 may be performed by control device 310. The control device 310 performs the write procedure 1200 by sending control signals to memory 320. The write procedure 1200 of FIG. 12 can be implemented in two phases in cases where the drive strength of access transistor 552 is weak. When the access transistor 552 is weak, writing a "1" (e.g., per FIG. 11) into the selected bit cell may be difficult as this requires the access transistor 552 to pass a high voltage from bit line 550 on to first storage node 510. On the other hand, draining first storage node 510 to write a "0" (e.g., per FIG. 10) into first storage node 510 is easier. Thus, writing to a selected bit cell may be accomplished in two phases.

In the first phase 1210, logical "1" is written to every bit cell in a selected row. During this phase, word line 570 and the second write word line 590 of the given row are driven to "1" (e.g., as shown in FIG. 11). This enables the access transistor 552 to be turned ON and drive the signal "1" from bit line 550 on to first storage node 510, driving first storage node 510 to logical "1". Further, since the second write word line 590 is driven to "1", an additional boost is provided to first storage node 510 through NMOS transistor 514. For example, to write a data pattern of "1010" to a row of four bit cells (e.g., bit cells [3:0], for example, where bit cell [3] is written with "1", bit cell [2] is written with "0", bit cell [1] is written with "1" and bit cell [0] is written with "0") the first phase 1210 would comprise writing "1" to each of the four bit cells in the row, or writing the pattern "1111" to bit cells [3:0].

In the second phase 1220, the desired data pattern "1010" is written to the row of the four bit cells. In particular, word line 570 for the given row is driven to "1", whereas the second write word line 590 of the given row is driven to "0", as shown in FIG. 10. For bit cells [2] and [0] which are to be written with the value of "0", their corresponding bit lines 550 carry the value "0". Thus, for writing "0" to bit cells [2] and [0], their corresponding access transistors 552 are turned ON and drive "0" from their corresponding bit lines 550 on to their corresponding first storage nodes 510, forming logical "0"s at the respective first storage nodes 510. Once again, the second write word line 590 (which is driven to "0") is provided to drain first storage nodes 510 to logical "0" through NMOS transistors 514 of bit cells [2] and [0].

For the remaining bit cells [3] and [1] which are to be written with a value of "1", the same combination of word line 570 being "1" and second write word line 590 being "0" is preserved, since they are in the same row as bit cells [2] and [0]. However, in the second phase 1220, the write of "1" will not be difficult because the bit cells [3] and [1] already have "1" stored in them from the first phase 1210. In more detail, for bit cells [3] and [1], their corresponding bit lines 550 carry the value of "1" and their access transistors 552 are turned on to drive "1" from the bit lines 550 to the corresponding first storage nodes 510. The extra boost from the second word line 590 is not required for the write of "1" in this case. Accordingly, the two phase write operation can be used for writing a data pattern comprising a combination of logic value "1" and logic value "0" to a row of 7T SRAM bit cells, wherein in the first phase, writing a logic value of "1" to the 7T SRAM bit cells in the row and in the second phase, writing the combination of logic value "1" and logic value "0" to the 7T SRAM bit cells in the row.

Accordingly, the exemplary 7T SRAM bit cell is configured to mitigate read disturbance and half-select issues and also improve noise margins by the use of the transmission gate 540 which can selectively couple or decouple the first storage node 510 and the gate node 530 based on the mode of operation. Writeability of the 7T SRAM bit cell is also improved by providing the boost through the second word line 590.

Figure 13:
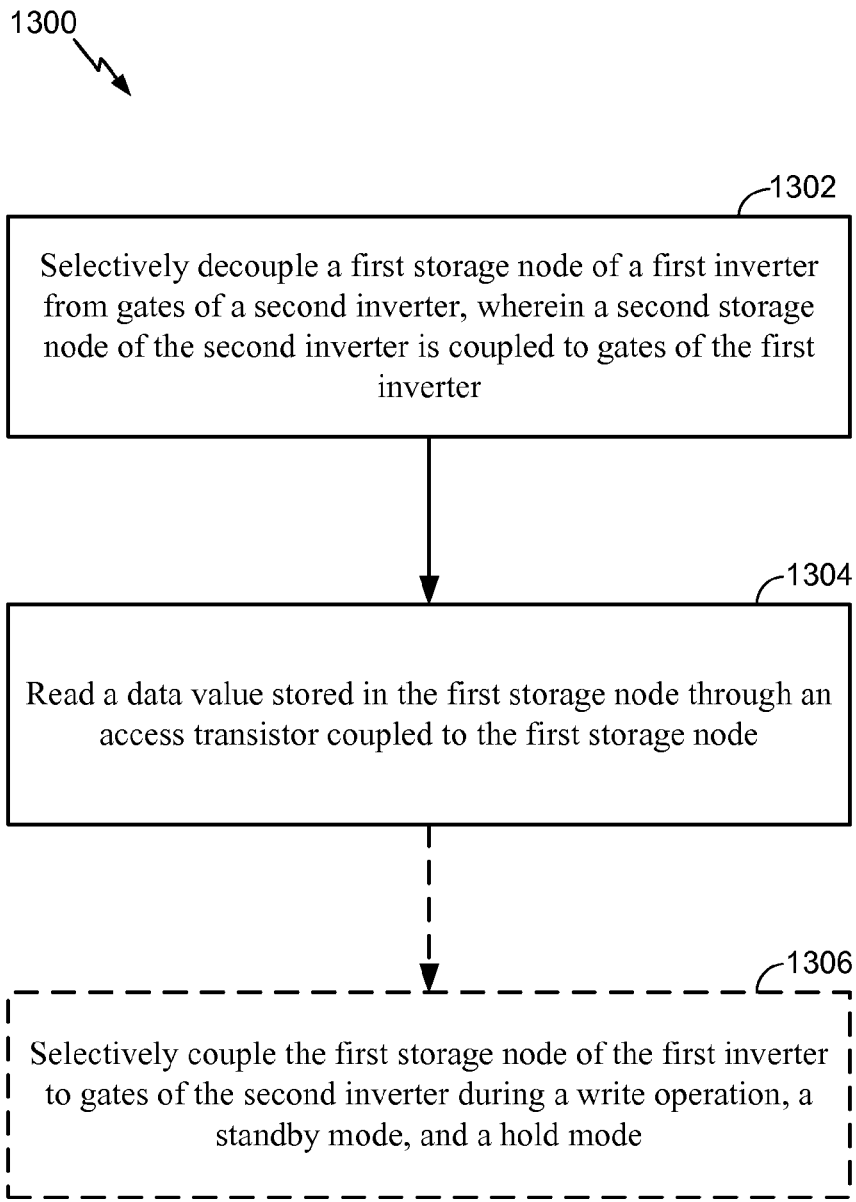
FIG. 13 illustrates a procedure for operating an exemplary 7T SRAM bit cell.

Accordingly, it will be appreciated that aspects include various methods for performing the processes, functions and/or algorithms disclosed herein. For example, as illustrated in FIG. 13, an aspect can include a method 1300 of operating a seven transistor static random-access memory (7T SRAM) bit cell (e.g., 500), the method comprising: during a read operation (e.g., FIG. 9), selectively decoupling (e.g., by disabling NMOS transistor 544 and PMOS transistor 542 of the transmission gate 540) a first storage node (e.g., 510) of a first inverter (e.g., formed from transistors 512, 514) from gates (e.g., at gate node 530) of a second inverter (e.g., formed from transistors 522, 524), wherein a second storage node (e.g., 520) of the second inverter is coupled to gates of the first inverter—Block 1302; and reading a data value stored in the first storage node through an access transistor (e.g., 552) coupled to the first storage node—Block 1304. Additionally, in optional aspects illustrated with dashed lines, the method 1300 may involve processes related to selectively coupling the first storage node of the first inverter to gates of the second inverter during a write operation (e.g., by enabling NMOS transistor 544, FIGS. 10-11), a standby mode (e.g., by enabling the NMOS transistor 544 and the PMOS transistor 542, FIG. 7), and a hold mode (e.g., by enabling the PMOS transistor 542, FIG. 8)—Block 1306.

Similarly, an exemplary aspect can also include a system comprising a seven transistor static random-access memory (7T SRAM) bit cell (e.g., 500). The system can include means for selectively decoupling (e.g., deactivated NMOS transistor 544 and PMOS transistor 542 of the transmission gate 540) a first storage node (e.g., 510) of a first inverter (e.g., formed from transistors 512, 514) from gates (e.g., at gate node 530) of a second inverter (e.g., formed from transistors 522, 524), wherein a second storage node (e.g., 520) of the second inverter is coupled to gates of the first inverter, and means (e.g., access transistor 552) for reading a data value stored in the first storage node. Moreover, the system may further comprise means for selectively coupling the first storage node of the first inverter to gates of the second inverter during a write operation (e.g., activated NMOS transistor 544, FIGS. 10-11), a standby mode (e.g., activated NMOS transistor 544 and PMOS transistor 542, FIG. 7), and a hold mode (e.g., activated PMOS transistor 542, FIG. 8).

Figure 14:
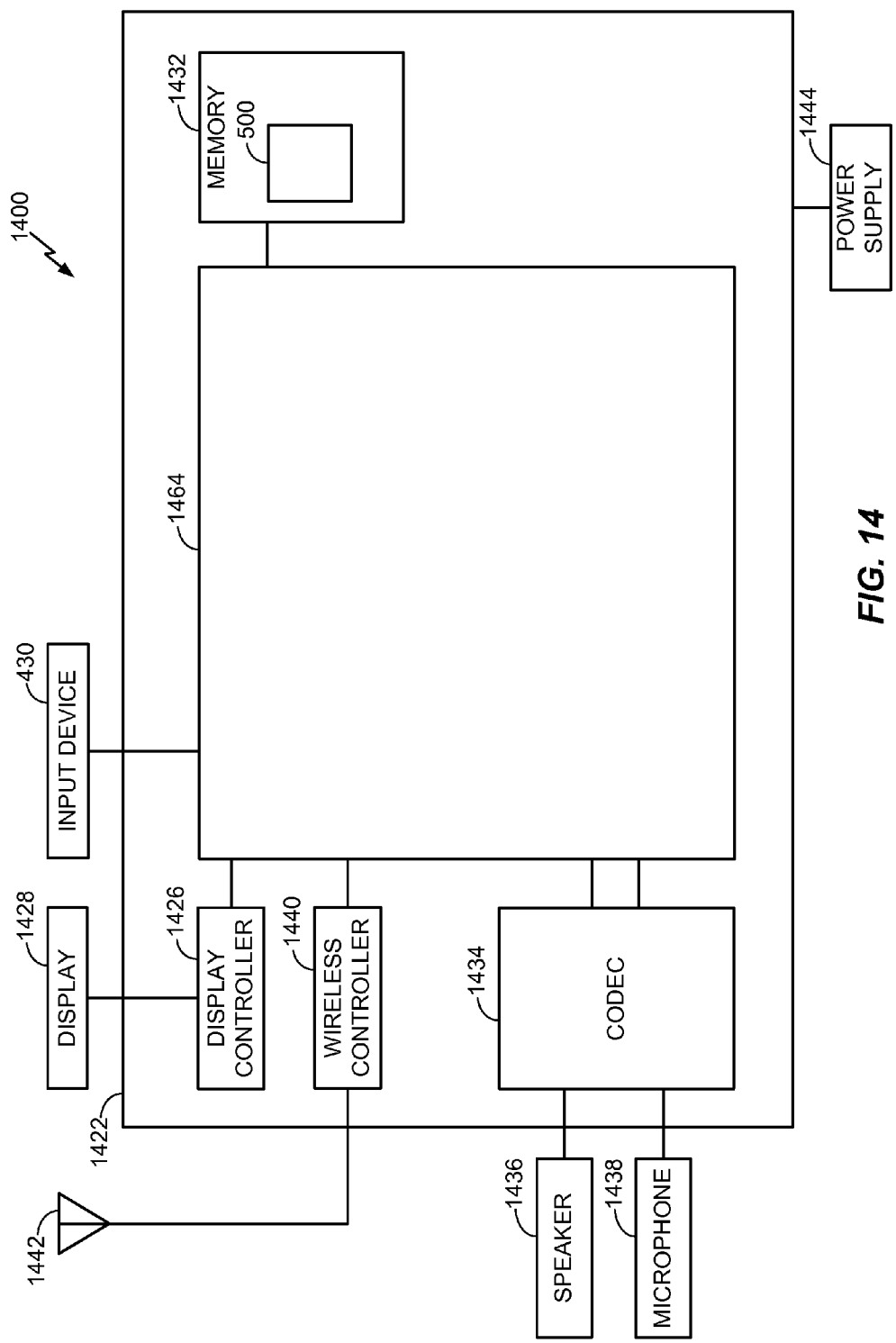
FIG. 14 illustrates a high-level diagram of a wireless device that includes an exemplary memory device according aspects of this disclosure.

Referring to FIG. 14, a block diagram of a particular illustrative aspect of a wireless device that includes a multi-core processor configured according to exemplary aspects is depicted and generally designated 1400. The device 1400 includes a processor 1464 which may include processing system 100 of FIG. 1. FIG. 14 also shows display controller 1426 that is coupled to processor 1464 and to display 1428. Coder/decoder (CODEC) 1434 (e.g., an audio and/or voice CODEC) can be coupled to processor 1464. Other components, such as wireless controller 1440 (which may include a modem) are also illustrated. Speaker 1436 and microphone 1438 can be coupled to CODEC 1434. FIG. 14 also indicates that wireless controller 1440 can be coupled to wireless antenna 1442. In a particular aspect, processor 1464, display controller 1426, memory 1432, CODEC 1434, and wireless controller 1440 are included in a system-in-package or system-on-chip device 1422. The memory 1432 may comprise the SRAM bit cell 500 of FIG. 5. Additionally or alternatively, processor 1464 may include another memory structure, such as a cache or a register file (not shown) which comprise SRAM bit cell 500.

In a particular aspect, input device 1430 and power supply 1444 are coupled to the system-on-chip device 1422. Moreover, in a particular aspect, as illustrated in FIG. 14, display 1428, input device 1430, speaker 1436, microphone 1438, wireless antenna 1442, and power supply 1444 are external to the system-on-chip device 1422. However, each of display 1428, input device 1430, speaker 1436, microphone 1438, wireless antenna 1442, and power supply 1444 can be coupled to a component of the system-on-chip device 1422, such as an interface or a controller.

It should be noted that although FIG. 14 depicts a wireless communications device, processor 1464 and memory 1432 may also be integrated into devices such as a set-top box, a music player, a video player, an entertainment unit, a navigation device, a personal digital assistant (PDA), a mobile phone, a fixed location data unit, or a computer. In some cases, processor 1464, memory 1432, along with one or more components of wireless device 1400, which include exemplary bit cells such as bit cell 500, may also be integrated in at least one semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for operating a seven transistor static random-access memory (7T SRAM) bit cell. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A seven-transistor static random-access memory (7T SRAM) bit cell comprising: a first inverter comprising a first pull-up transistor, a first pull-down transistor, and a first storage node; a second inverter comprising a second pull-up transistor, a second pull-down transistor, and a second storage node, wherein the second storage node is coupled to gates of the first pull-up transistor and the first pull-down transistor; an access transistor directly coupled to the first storage node; and a transmission gate configured to selectively couple the first storage node to gates of the second pull-up transistor and the second pull-down transistor.

2. The 7T SRAM bit cell of claim 1, wherein the transmission gate comprises a PMOS transistor and an NMOS transistor coupled in parallel.

3. The 7T SRAM bit cell of claim 2, wherein the PMOS transistor is configured to be activated in a hold mode and a standby mode, and configured to deactivated to be deactivated in a read mode and a write mode.

4. The 7T SRAM bit cell of claim 2, wherein a gate of the PMOS transistor is coupled to a word line coupled to a gate of the access transistor.

5. The 7T SRAM bit cell of claim 2, wherein the NMOS transistor is configured to be activated in a write mode and a standby mode and configured to be deactivated in a hold mode and a read mode.

6. The 7T SRAM bit cell of claim 5, wherein a gate of the NMOS transistor is coupled to a first write word line.

7. The 7T SRAM bit cell of claim 1, wherein the access transistor is configured to couple a bit line to the first storage node and the access transistor is configured to be activated in a read mode or a write mode.

8. The 7T SRAM bit cell of claim 7, wherein the first pull-down transistor is coupled to a second write word line.

9. The 7T SRAM bit cell of claim 1, wherein the transmission gate is configured to be turned off during a read operation.

10. The 7T SRAM bit cell of claim 1, wherein the transmission gate is configured to be turned off when the 7T SRAM is not selected for a write operation.

11. The 7T SRAM bit cell of claim 1, integrated in a device selected from the group consisting of a set-top box, music player, video player, entertainment unit, navigation device, communications device, personal digital assistant (PDA), fixed location data unit, mobile phone, and a computer.

12. The 7T SRAM bit cell of claim 1, wherein the second storage node is directly coupled to gates of the first pull-up transistor and the first pull-down transistor.

13. The 7T SRAM bit cell of claim 1, wherein a first terminal of the transmission gate is directly coupled to the first storage node and a second terminal of the transmission gate is directly coupled to the gates of the second pull-up transistor and the second pull-down transistor.

14. A method of operating a seven-transistor static random-access memory (7T SRAM) bit cell, the method comprising: during a read operation, selectively decoupling a first storage node of a first inverter from gates of a second inverter, wherein a second storage node of the second inverter is coupled to gates of the first inverter; and reading a data value stored in the first storage node through an access transistor directly coupled to the first storage node.

15. The method of claim 14, wherein the selectively decoupling comprises selectively deactivating a transmission gate formed from a PMOS transistor and an NMOS transistor coupled in parallel.

16. The method of claim 15, further comprising selectively coupling the first storage node of the first inverter to the gates of the second inverter during a write operation by activating the NMOS transistor of the transmission gate through a first write word line.

17. The method of claim 16, further comprising, enabling the access transistor through a word line to write a logic value of "0" from a bit line coupled to the access transistor to the first storage node.

18. The method of claim 17 further comprising coupling a first pull-down transistor of the first inverter to a second write word line driven to a logic "0" to provide a boost for writing the logic value of "0" to the first storage node.

19. The method of claim 16, further comprising, enabling the access transistor through a word line to write a logic value of "1" from a bit line coupled to the access transistor to the first storage node.

20. The method of claim 19 further comprising coupling a first pull-down transistor of the first inverter to a second write word line driven to a logic "1" to provide a boost for writing the logic value of "1" to the first storage node.

21. The method of claim 16, further comprising, for writing a data pattern comprising a combination of logic values to a row of 7T SRAM bit cells comprising the 7T SRAM bit cell:
   writing a logic value of "1" to the 7T SRAM bit cells in the row in a first phase; and
   writing the data pattern comprising the combination of logic values to the 7T SRAM bit cells in the row in a second phase.

22. The method of claim 15, further comprising, during a standby mode, selectively coupling the first storage node of the first inverter to the gates of the second inverter by turning on the PMOS transistor through a word line coupled to the access transistor and turning on the NMOS transistor through a first word line.

23. The method of claim 15, further comprising, during a hold mode, selectively coupling the first storage node of the first inverter to the gates of the second inverter by turning off the PMOS transistor through a word line coupled to the access transistor and turning on the NMOS transistor through a first word line.

24. The method of claim 14, further comprising, selectively decoupling the first storage node of the first inverter from the gates of the second inverter when the 7T SRAM bit cell is not selected for a write operation.

25. A seven-transistor static random-access memory (7T SRAM) bit cell comprising: means for selectively decoupling a first storage node of a first inverter from gates of a second inverter of the SRAM bit cell during a read operation, wherein a second storage node of the second inverter is coupled to gates of the first inverter; and means for reading a data value stored in the first storage node through an access transistor directly coupled to the first storage node.

26. The 7T SRAM bit cell of claim 23, further comprising means for selectively coupling the first storage node of the first inverter to the gates of the second inverter during a write operation, a standby mode, and a hold mode.

* * * * *